(12) United States Patent
McCarthy

(10) Patent No.: US 11,907,612 B2
(45) Date of Patent: Feb. 20, 2024

(54) APPARATUS, SYSTEMS AND METHODS FOR LIMITING OUTPUT VOLUME OF A MEDIA PRESENTATION DEVICE

(71) Applicant: DISH Technologies L.L.C., Englewood, CO (US)

(72) Inventor: Bernard A. McCarthy, Atlanta, GA (US)

(73) Assignee: DISH Technologies L.L.C., Englewood, CO (US)

(*) Notice: Subject to any disclaimer, the term of this patent is extended or adjusted under 35 U.S.C. 154(b) by 0 days.

(21) Appl. No.: 17/573,459

(22) Filed: Jan. 11, 2022

(65) Prior Publication Data
US 2022/0129241 A1    Apr. 28, 2022

Related U.S. Application Data

(60) Continuation of application No. 16/536,670, filed on Aug. 9, 2019, now Pat. No. 11,231,902, which is a
(Continued)

(51) Int. Cl.
*G06F 3/16* (2006.01)
*H03G 7/00* (2006.01)
(Continued)

(52) U.S. Cl.
CPC .......... *G06F 3/165* (2013.01); *G06F 3/04842* (2013.01); *H03G 3/32* (2013.01); *H03G 7/007* (2013.01); *H04N 21/4852* (2013.01)

(58) Field of Classification Search
CPC .. H04R 2430/01; H04R 27/00; H04R 1/1041; H04R 1/1083; H04R 2227/005;
(Continued)

(56) References Cited

U.S. PATENT DOCUMENTS 5,771,297 A    6/1998  Richardson
7,278,101 B1 * 10/2007 Cassezza ................. H04S 7/00
                                                         715/740
(Continued)

FOREIGN PATENT DOCUMENTS

DE    19648871 A1   5/1998
EP    2149983 A1    2/2010
(Continued)

OTHER PUBLICATIONS

Diurnal Sound Control for Personal Computers Publication-Data: IBM Technical Disclosure Bulletin, Oct. 1993, US, p. 549-552.

*Primary Examiner* — Lun-See Lao
(74) *Attorney, Agent, or Firm* — Perkins Coie LLP

(57) ABSTRACT

Volume limiting systems and methods are operable to limit volume output from media presentation devices. An exemplary embodiment detects a sound using a microphone, wherein the sound corresponds to an audio output of at least one controlled media presentation device, and wherein the microphone is remotely located from the at least one controlled media presentation device; compares a level of the detected sound with a predefined maximum volume limit; generates a volume output limit command in response to the detected sound exceeding the predefined maximum volume limit; and communicates the volume output limit command to the media presentation device. The media presentation device then reduces a volume level of its audio output. In some instances, volume may be limited during user specified periods.

20 Claims, 3 Drawing Sheets

Related U.S. Application Data continuation of application No. 16/004,155, filed on Jun. 8, 2018, now Pat. No. 10,379,807, which is a division of application No. 15/262,491, filed on Sep. 12, 2016, now Pat. No. 9,996,313, which is a division of application No. 14/673,235, filed on Mar. 30, 2015, now Pat. No. 9,442,692, which is a continuation of application No. 12/790,638, filed on May 28, 2010, now Pat. No. 8,995,685.

(51) Int. Cl.
  *H03G 3/32* (2006.01)
  *G06F 3/04842* (2022.01)
  *H04N 21/485* (2011.01)

(58) Field of Classification Search
  CPC .. H04R 2420/07; H04R 25/356; H04R 3/002; H04R 29/00; H04R 5/04; H04R 2225/023; H04R 2410/00; H04R 25/02; H04R 25/502; H03G 3/3089; H03G 9/025; H03G 3/32; H03G 7/002; H03G 7/007; H03G 7/06; H03G 3/3005; H03G 5/005; H03G 5/165; H03G 1/02; G06F 3/165; G10L 21/0232; G10L 15/26; G10L 2015/223; G10L 25/78; G10L 13/00; G10L 2015/088; G10L 21/0208; G10L 25/00; H04M 19/04; H04M 19/048; H04M 1/22; H04M 1/72563; H04M 9/082; H04M 9/08; H04L 29/06414; H04L 65/104; H04S 2400/13; H04S 2420/03; H04S 7/303; H04S 7/304
  USPC .......... 381/104–106, 56–58, 92, 1; 700/94; 348/14.02–14.5
  See application file for complete search history.

(56) References Cited

U.S. PATENT DOCUMENTS

| | | | |
|---|---|---|---|
| 7,693,288 B2 | 4/2010 | Mergler | |
| 8,995,685 B2 | 3/2015 | McCarthy | |
| 9,442,692 B2 | 9/2016 | McCarthy | |
| 9,996,313 B2 | 6/2018 | McCarthy | |
| 10,379,807 B2 | 8/2019 | McCarthy | |
| 11,231,902 B2* | 1/2022 | McCarthy | H03G 3/32 |
| 2006/0193483 A1* | 8/2006 | Wood | H04R 3/00 381/104 |
| 2007/0053527 A1 | 3/2007 | Barbieri | |
| 2008/0118086 A1* | 5/2008 | Krig | H04N 21/84 348/E5.122 |
| 2009/0310805 A1 | 12/2009 | Petroff | |
| 2020/0110573 A1 | 4/2020 | McCarthy | |

FOREIGN PATENT DOCUMENTS

| | | | | |
|---|---|---|---|---|
| EP | 2149983 | * | 3/2010 | ............ H03G 3/30 |
| GB | 2292854 A | | 3/1996 | |
| GB | 2370927 A | | 7/2002 | |

* cited by examiner

APPARATUS, SYSTEMS AND METHODS FOR LIMITING OUTPUT VOLUME OF A MEDIA PRESENTATION DEVICE

PRIORITY CLAIM

This patent application is a Continuation of U.S. application Ser. No. 16/536,670, filed Aug. 9, 2019, published as U.S. Publication No. 2020/0110573, entitled "APPARATUS, SYSTEMS AND METHODS FOR BUFFERING OF MEDIA CONTENT," which is a Continuation of U.S. patent application Ser. No. 16/004,155, filed Jun. 8, 2018, published as U.S. Publication No. 2018/0293048, entitled "APPARATUS, SYSTEMS AND METHODS FOR LIMITING OUTPUT VOLUME OF A MEDIA PRESENTATION DEVICE," and granted as U.S. Pat. No. 10,379,807 on Aug. 13, 2019, which is a Divisional of U.S. application Ser. No. 15/262,491, filed Sep. 12, 2016, published as U.S. Publication No. 2016/0378430, entitled "APPARATUS, SYSTEMS AND METHODS FOR LIMITING OUTPUT VOLUME OF A MEDIA PRESENTATION DEVICE," and granted as U.S. Pat. No. 9,996,313 on Jun. 12, 2018, which is a Divisional of U.S. application Ser. No. 14/673,235, filed Mar. 30, 2015, published as U.S. Publication No. 2015/0205576, entitled "APPARATUS, SYSTEMS AND METHODS FOR LIMITING OUTPUT VOLUME OF A MEDIA PRESENTATION DEVICE," and granted as U.S. Pat. No. 9,442,692 on Sep. 13, 2016, which is a Continuation of U.S. application Ser. No. 12/790,638, filed May 28, 2010, published as U.S. Publication No. 2011/0293113, entitled "APPARATUS, SYSTEMS AND METHODS FOR LIMITING OUTPUT VOLUME OF A MEDIA PRESENTATION DEVICE," and granted as U.S. Pat. No. 8,995,685 on Mar. 31, 2015, the content of which are herein incorporated by reference in their entirety.

BACKGROUND

Media devices, such as a set top box, a stereo, a television, a computer system, a game system, or the like, are configured to present programming to one or more users. Such programming may contain video information and audio information. In some situations, the programming may be an audio only type of program, such as a music channel, a music station, or the like.

Volume of the audio information is controlled by the user. However, it is possible for a user to increase the volume of the output audio information to such an extent that others may be annoyed, bothered or otherwise distracted. For example, children may wake early Saturday morning to watch their favorite cartoons. If the children are allowed to control the media device in an unsupervised manner, the parents may not be able to sleep in. As another example, a user may watch a movie late at night. At times, especially if the movie is an action film with explosions or the like, the output volume from the media presentation device may be so loud as to wake or disturb other members of the household. As yet another example, loud music played at a late-night party may disturb the neighbors.

Accordingly, there is a need in the arts to limit volume of a media device.

SUMMARY

Systems and methods of limiting volume output from media presentation devices are disclosed. An exemplary embodiment detects a sound using a microphone, wherein the sound corresponds to an audio output of at least one controlled media presentation device, and wherein the microphone is remotely located from the at least one controlled media presentation device; compares a level of the detected sound with a predefined maximum volume limit; generates a volume output limit command in response to the detected sound exceeding the predefined maximum volume limit; and communicates the volume output limit command to the media presentation device. The media presentation device then reduces a volume level of its audio output. In exemplary embodiments, the volume may be limited during user specified periods.

BRIEF DESCRIPTION OF THE DRAWINGS

Preferred and alternative embodiments are described in detail below with reference to the following drawings.

DETAILED DESCRIPTION

Figure 1:
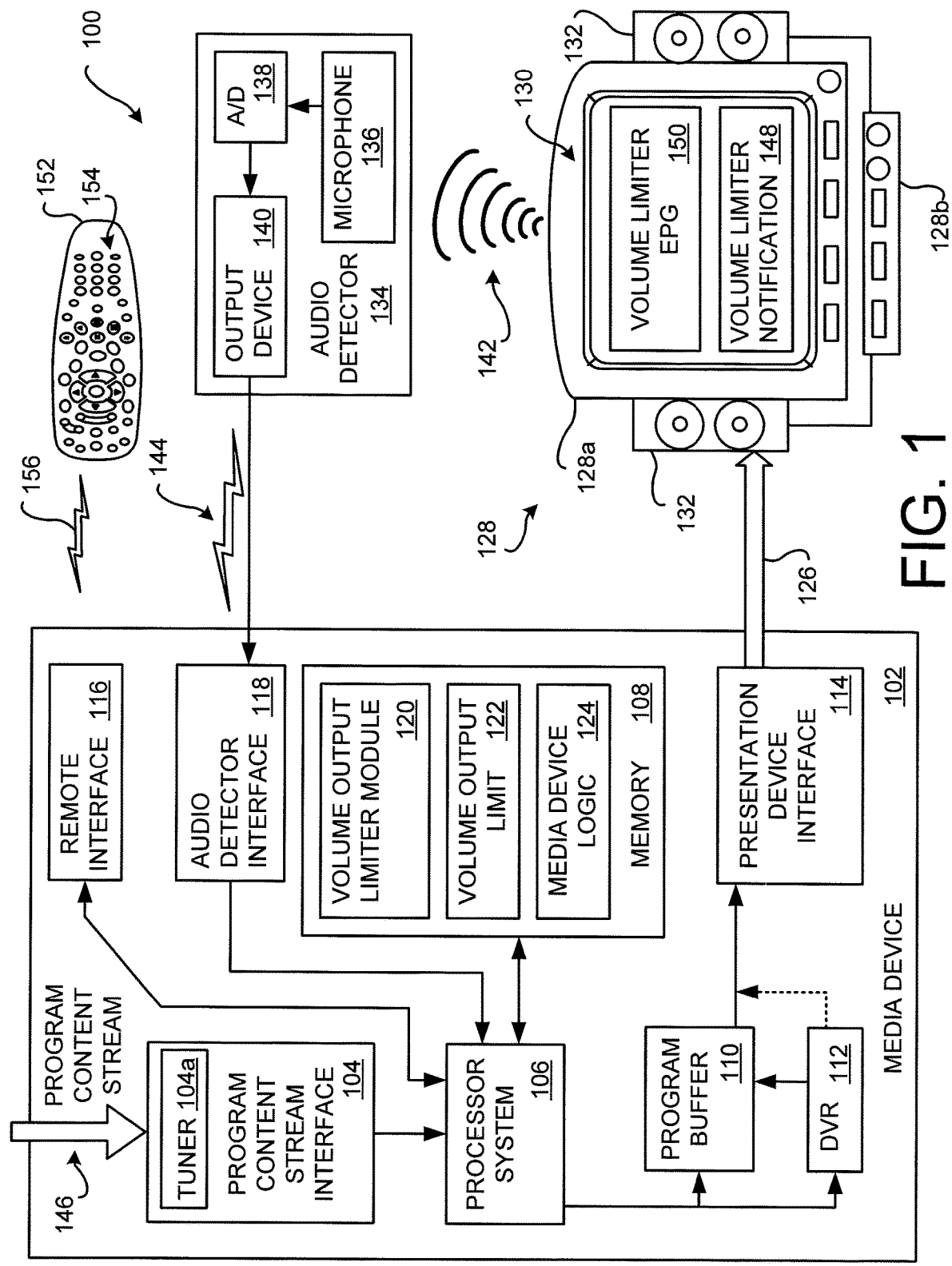
FIG. 1 is a block diagram of an embodiment of a scheduled volume limiter.

FIG. 1 is a block diagram of an embodiment of a scheduled volume limiter 100 implemented in a media device 102, such as, but not limited to, a set top box (STB). Embodiments of the scheduled volume limiter 100 may be implemented in other media devices, such as, but not limited to, stereos, surround-sound receivers, radios, televisions (TVs), digital video disc (DVD) players, digital video recorders (DVRs), game playing devices, or personal computers (PCs) that are configured to output audio information.

Embodiments of the scheduled volume limiter 100 are configured to limit output volume of presented programs. Depending upon the embodiment, volume output limits may be enforced by controlling the media device 102. In other situations, volume output limits may be enforced by indirectly controlling a media presentation device by controlling the media device 102 that directly controls the media presentation device.

Volume output limits may be enforced in accordance with a user defined enforcement period. The enforcement period may be defined by scheduling specified dates, days, times, and/or durations. Volume output limits may be set for a single enforcement period, or may be set for re-occurring enforcement periods.

For example, parents may define a maximum volume output from the television on Saturday morning from 7:00-9:00 a.m. When their children wake early Saturday morning to watch their favorite cartoons, volume output of the television is limited for the predefined enforcement period during Saturday morning so that the parents may be able to sleep in without being disturbed by the loud volume of the morning cartoons.

As another example, a user may watch a movie late at night. The scheduled volume limiter 100 could be set to limit volume output from 10:00 p.m. for 8 hours. Accordingly, if the movie is an action film with explosions or the like, the output volume is limited so that other members of the household are not disturbed. The scheduled volume limit could be set in a manner such that volume output is limited during that particular enforcement period.

As yet another example, loud music played at a late-night party that would otherwise disturb the neighbors could be automatically limited so that party goers are not able to increase the volume output of the stereo system beyond some predefined volume output limit. The scheduled volume limit could such that volume output is limited during the enforcement period every Friday and Saturday night.

The exemplary, non-limiting media device 102 comprises a program content stream interface 104, a processor system 106, a memory 108, a program buffer 110, an optional digital video recorder (DVR) 112, a presentation device interface 114, a remote interface 116, and an optional audio detector interface 118. The memory 108 comprises portions for storing a volume output limiter module 120, one or more volume output limits 122, and the media device logic 124. In some embodiments, the volume output limiter module 120 and the media device logic 124 may be integrated together, and/or may be integrated with other logic. Other media devices may include some, or may omit some, of the above-described media processing components. Further, additional components not described herein may be included in alternative embodiments.

In this non-limiting exemplary embodiment, the media device 102 provides streamed program content 126 to one or more media presentation devices 128. The presentation device interface 114 is illustrated as coupled to two exemplary media presentation devices 128, a television (TV) 128a and an audio device 128b. Non-limiting examples of the audio device 128b include a stereo, a compact disk (CD) player, a radio, a surround-sound receiver, or combinations thereof.

The video portion of the streamed program content 126 is displayed on the TV display 130 and the audio portion of the streamed program content 126 is reproduced as sounds by one or more TV speakers (not shown). The volume output of the audio portion may be controllable at the TV 128b, and/or may be controllable at the media device 102.

Alternatively, or additionally, the audio portion of the streamed program content 126 may reproduced as sounds by a plurality of speakers 132 of the audio device 128b. The volume output of the audio portion may be controllable at the audio device 128b, and/or may be controllable at the media device 102.

The exemplary media device 102 is configured to receive volume output information communicated from one or more audio detectors 134. The exemplary audio detector 134 comprises a microphone 136, an optional analog to digital (A/D) converter 138, and an output device 140. Other audio detectors 134 may include some, or may omit some, of the above-described components. Further, additional components not described herein may be included in alternative embodiments. Any suitable microphone 136, an A/D converter 138, and/or an output device 140 may be used in the various embodiments.

The microphone 136 detects sounds 142 emitted from one or more of the media presentation devices 128. The microphone 136 may also detect other ambient noises.

In an exemplary embodiment, the analog output from the microphone 136 is received by the optional A/D converter 138 and converted into a digital signal. The digital signal is received by the output device 140 and is communicated as audio information 144. The communicated digital audio information 144 is received by the audio detector interface 118 of the media device 102. Alternatively, or additionally, the analog signal from the microphone 136 may be received directly by the output device 140 and communicated to the media device 102 as analog audio information 144.

The audio information 144 may be communicated to the media device 102 using an infrared signal or a radio frequency (RF) signal medium. In such embodiments, the optional audio detector interface 118 is configured to receive infrared signals or RF signals. Alternatively, the remote interface 116 may be configured to receive the audio information 144. Alternatively, or additionally, the audio detector 134 may communicate the audio information 144 to the media device 102 over a physical wire, cable, or the like.

Preferably, the audio detector 134 is a portable device that may be located and oriented in a manner such that the microphone 136 primarily detects the sounds 142 emitted from the controlled media presentation devices 128. For example, if the user is watching television on the TV 128a, the audio detector 134 may be located in proximity to the user and may be oriented towards the TV 128a. Alternatively, or additionally, the audio detector 134 may be located near a door of a media room where the audio device 128b is playing music so that the volume output level can be determined at a point where the sound 142 is leaving the media room. Any suitable location and/or orientation of the audio detector 134 may be selected so as to detect the sounds 142.

The functionality of the exemplary media device 102, here a set top box, is now broadly described. A program provider provides program content that is received in one or more program content streams 146. A program content stream 146 typically comprises a plurality of programs multiplexed together. The one or more program content streams 146 are communicated to the media device 102 from a media system sourced from a remote head end facility (not shown) operated by a media provider. Non-limiting examples of such media systems include satellite systems, cable system, and the Internet. For example, if the program provider provides programming via a satellite-based communication system, the media device 102 is configured to receive one or more broadcasted satellite signals detected by an antenna (not shown). Alternatively, or additionally, the program content stream 146 can be received from one or more different sources, such as, but not limited to, a cable system, a radio frequency (RF) communication system, another electronic device, or the Internet.

The one or more program content streams 146 are received by the program content stream interface 104. One or more tuners 104a in the program content stream interface 104 selectively tune to one of the program content streams 146 in accordance with instructions received from the processor system 106. The processor system 106, based upon a request for a program of interest specified by a user, parses out program content associated with the program of interest. The program of interest is then assembled into a stream of video and/or audio information which may be stored by the program buffer 110 such that the program content can be streamed out to the media presentation device, such as the TV 128a, via the presentation device interface 114. Alternatively, or additionally, the parsed-out program content may be saved into the DVR 112 for later presentation.

The exemplary media device 102 is configured to receive commands from a user via a remote control 152. The remote control 152 includes one or more controllers 154. The user, by actuating one or more of the controllers 154, causes the remote control 152 to generate and transmit commands, via a wireless signal 156, to the media device 102. The commands control the media device 102 and/or control the media presentation devices 128. The wireless signal 156 may be an infrared signal or an RF signal.

The above processes performed by the media device 102 are generally implemented by the processor system 106 while executing the media device logic 124. Thus, the media device 102 may perform a variety of functions, including maintaining a clock, a calendar, and/or a timer that is used by embodiments of the scheduled volume limiter 100 for scheduling of the enforcement period. The processor system 106 retrieves and executes the volume output limiter module 120 so that, during the enforcement period occurring at the predefined or specified dates, times, and/or durations, the volume output emitted from one or more of the media presentation devices 128 is limited.

Volume output limit parameters are set by the user. Examples of volume output limit parameters include, but are not limited to, a maximum volume limit, channel, and/or program identified by title. Enforcement parameters also define the enforcement period wherein the user specifies a predefined or specified date, time, and/or duration. An exemplary volume output limit parameter may specify that the enforcement period is periodically enforced (e.g., every Friday night from 10:00 p.m. to midnight) or is enforced only a single time.

In an exemplary embodiment, a volume limiter electronic program guide (EPG) 150 is presented to assist the user in defining the volume output limit parameters. For example, the volume limiter EPG 150 may be presented on the exemplary display 130 of the TV 128a. The volume limiter EPG 150 is a type of a user interface that presents a menu, or a series of menus, that use a combination of text and symbols to indicate volume output limit parameters choices that may be selected by the user.

The volume limiter EPG 150 is interactive with the user. The user, via their remote control 152, "scrolls" or "navigates" about the volume limiter EPG 150 presented on the display 130 to select volume output limit parameters. When the user highlights the portion of the volume limiter EPG 150 corresponding to a particular one of the volume output limit parameters, the user actuates one or more controllers 154 to cause the media device 102 to define that particular volume output limit parameter. The user specified volume output limit parameters are used to define the volume output limit 122. Other embodiments may permit definition of the start time using other suitable devices.

Each volume output limit 122 is defined by a start time that denotes the start of the enforcement period. A clock, timer or other similar timing function is monitored by the processor system 106.

Each volume output limit 122 is further defined by an end time or duration that denotes the end of the enforcement period. A clock, timer or other similar timing function is monitored by the processor system 106 to identify the end time or expiration of the specified enforcement period.

Optionally, the volume output limit 122 may define a channel and/or program that may be subject to a volume output limit enforcement. In some embodiments, a program EPG that presents available programming choices to the user may also be used to specify a selected channel and/or program that will be subject to a volume output limit. Here, the user navigates about the program EPG, highlights a selected channel and/or program, and actuates one or more of the controllers 154 on the remote control 152 to select the channel and/or program. If a particular program is selected, then the start and end times for the enforcement period may be based upon the start and end times of the selected program.

Each volume output limit 122 is further defined by a maximum volume limit. The maximum volume limit is associated with the volume output of the media presentation devices 128. That is, embodiments of the scheduled volume limiter 100 are configured to limit volume output of one or more media presentation devices 128 under the presumption that limiting volume output from the media presentation devices 128 will limit the sound 142.

In an exemplary embodiment, the maximum volume limit may be interactively defined by the user based on the current volume output of the controlled media presentation devices 128. For example, a test tone or sound may be presented to the user when a volume output limit 122 is being defined. Alternatively, the volume output of a currently presented program may be used when a volume output limit 122 is being defined. The user may interactively adjust the volume output of the controlled media presentation devices 128, such as by using their remote control 152 and/or volume controllers residing on the controlled media presentation devices 128.

When the level of the test tone, the test sound, or the program sound is at a desired level, the user may actuate one of the controllers 154 on the remote control 152, or actuate another controller, to specify the desired maximum volume limit. That is, the embodiment receives a specification based upon a sound level of interest determined by the user. Then, the maximum volume limit is defined based upon the sound 142 detected using the microphone 136 at substantially the time of receiving the specification from the user. Accordingly, when the scheduled volume limiter 100 is enforcing volume limits, the maximum volume limit specified in the volume output limit 122 is used to generate a volume output limit command that limits or otherwise adjusts the volume output level of the controlled media presentation devices 128.

During the enforcement period, the audio information 144 communicated to the media device 102 from the audio detector(s) 134 is compared with a specified maximum volume limit of the currently enforced volume output limit 122. When the value of the audio information 144 exceeds the maximum volume limit, then the volume output limit command is generated and communicated to the controlled media presentation devices 128. The volume output limit command changes a volume control setting of at least one of the media presentation devices 128. Accordingly, volume of the controlled media presentation device 128 is reduced in accordance with the volume output limit command.

The various embodiments may generate and communicate different types of volume output limit commands. One type of volume output limit command is a specified volume setting. For example, the volume output limit command may specify the volume setting of a particular controlled media presentation device 128. The volume output limit may be a specified volume output level setting and/or may be a specified percentage of its maximum volume output setting. Here, the volume output setting is reduced to the specified maximum volume limit, and other audio levels are correspondingly scaled down in accordance with the maximum volume limit.

Alternatively, or additionally, the volume output limit command may correspond to a single incremental volume setting change for the controlled media presentation devices 128. For example, but not limited to, the volume output limit command may specify an incremental volume setting decrease of "one" such that the controlled media presentation device 128 reduces its current volume setting down by one increment. For example, the output volume setting may be changed from a current setting of "7" to a new setting of "6" for the TV 128a. Incremental changes may be expressed in other formats, such as by percentage increments. For example, but not limited to, the output volume setting may be changed from a current setting of "70%" to a new setting of "60%" for the TV 128a.

Alternatively, or additionally, the volume output limit command may correspond to a threshold volume output limit such that any volume output from a controlled media presentation device 128 is clipped to the specified volume output limit. In such embodiments, the volume output of the controlled media presentation device 128 is only modified by clipping any audio that has a level exceeding the specified maximum volume limit. For example, the volume level for conversations among actors of an action film would not be reduced. In contrast, volume levels associated with loud explosions would be clipped to the specified maximum volume limit, and would accordingly, be "muffled" or otherwise attenuated.

When a plurality of media presentation devices 128 are controlled in accordance with a volume output limit 122, multiple different volume output limit commands may be generated and communicated to the different media presentation devices 128. The specific volume output limit commands may be unique to a particular controlled media presentation device 128. That is, one or more characteristics of the each volume output limit command is different. For example, if the volume output limit command are based on digital IR signal patterns, the IR signal patterns used to control the different media presentation devices 128 may be different.

For example, it may not be known if the TV 128a or the audio device 128b is generating the audio for a currently presented program. Upon determining that a maximum volume limit is being exceeded, the media device 102 may generate and communicate a first volume output limit command to the TV 128a to reduce output volume of the TV 128a. If the TV 128a is not providing audio output, the volume output limit command for the TV 128a will have no practical effect on the sound 142 detected by the audio detector 134. Concurrently, a second volume output limit command may be generated and communicated to the audio device 128b. Assuming that the user is watching a movie with surround sound provided by the audio device 128b, the second volume output limit command will reduce the output volume of the audio device 128b. Because the TV 128a and the audio device 128b may be built by different manufacturers or have different remote controller designs, the first volume output limit command will likely be different from the second volume output limit command.

Adjustment of the volume output from the controlled media presentation devices 128 may be performed on a real-time basis. For example, there may be no particular reason to reduce the actual output volume of a presented program below a specified maximum volume limit when the sound 142 is less that the enforced maximum volume limit. Embodiments may be configured to impose enforcement only when the detected sound 142 exceeds the maximum volume limit. At other times, volume output limit enforcement is not imposed on the media presentation devices 128.

Some embodiments may be configured to enforce a volume output limit based upon a detected peak value of the sound 142. Alternatively, or additionally, embodiments may be configured to enforce a volume output limit based upon a rolling average of peak sound levels over some predefined duration. In such embodiments, the occasional and/or infrequent "extra loud" peak in the detected sound 142 may not result in a reduction of the volume output of the controlled media presentation devices 128 based on the occasional or infrequent peak sound levels.

Alternatively, or additionally, embodiments may be configured to increase output volume of the media presentation devices 128 so as to increase the level of the sound 142 up to the specified maximum volume limit, or up to a second specified limit (thus defining a range for the level of the sound 142). For example, the user may be watching an action film with loud explosions. Embodiments may act to limit volume output during the explosions. However, to allow the user to hear conversations during less loud portions of the action movie, embodiments may detect the sound 142 at such times and increase the volume output of the media presentation devices 128 accordingly.

Some embodiments may enforce a maximum volume limit for a predefined duration. In an action movie with loud explosions, the very loud scenes may last a relatively long period of time. Accordingly, some embodiments may be configured to, based on a peak level of the detected sound 142, determine a volume output limit command that is enforced for a predefined duration, such as five minutes or the like. Then, a new volume output limit command may be determined based on a currently detected peak level of the sound 142. If the explosions are continuing, the new volume output limit command could be the same as the previous volume output limit command. On the other hand, if the scene with the explosions has concluded, the second volume output limit command would permit a higher output volume setting at the controlled media presentation devices 128.

Some embodiments may be configured to adjust the volume output limit command after the level of the detected sound 142 decreases below a second predefined level for a predefined duration. For example, when the action movie presents the scenes with the loud explosions, a first volume output limit command may be determined so as to limit the sound 142 during that particular scene. Once the explosions in that scene ends, the attendant volume output decreases. That is, the loud peak sounds associated with the explosions are no longer being detected. After the predefined duration, assuming no other peak sound levels are detected during the predefined duration, enforcement of the volume output limit is released. Accordingly, the volume setting of the controlled media presentation devices 128 may be increased. Thus, a second volume output limit command would be determined to permit a higher output volume setting of the controlled media presentation devices 128.

An anticipated difficulty with controlling output volume on a real-time basis is the potential effect of ambient noise that is detected by the audio detectors 134. That is, in addition to the output volume of the media presentation devices 128, ambient noise may also affect the sound level of the detected sound 142. In some situations, the ambient noise level may be higher than the output volume of the controlled media presentation devices 128. It would not necessarily be desirable to further reduce the volume output setting of the controlled media presentation devices 128 based upon detection of the loud ambient noise since such volume output limit changes would not significantly reduce the level of the detected sound 142 (as the ambient noise level is the predominant source of the detected sound 142).

Some embodiments may be configured to differentiate between the output volume of the controlled media presentation devices 128 and the volume level of any present ambient noise. For example, multiple audio detectors 134 may be positioned and oriented about the media room. Differences between the audio information 144 received from the different ones of the audio detectors 134 may be compared to more accurately determine the volume output of the controlled media presentation devices 128. Then, volume output limit command can be determined for the controlled media presentation devices 128.

Some embodiments may employ a directional type of microphone 136. Here, the directional microphone 136 in the audio detector 134 would be located and oriented to substantially detect volume output from the controlled media presentation device 128. Detection of ambient noise would be reduced since the sources of ambient noise would likely be outside of the direction and/or detection range of the directional microphone 136.

On the other hand, it may be desirable to reduce the volume output of the controlled media presentation devices 128 even when loud ambient noise is present. Some embodiments are configured to reduce volume output of the controlled media presentation devices 128 even when the ambient noise is the predominant source of the peak value of the sound 142. For example, children may be watching cartoons early Saturday morning. At times, the children may also be making loud noises. If the volume output of the controlled media presentation devices 128 is reduced, the children may realize that they need to quiet themselves if they want to continue hearing the audio portion of their cartoon. As another example, partygoers attending a late-night party may realize that they need to lower their voices if they want to listen to their music.

Some embodiments may be configured to define a first volume output limit parameter based on the level of the detected sound 142 that includes loud ambient noise. A second volume output limit 122 may be defined that differentiates between ambient noise and the output volume of the controlled media presentation devices 128. Accordingly, the user has flexibility to tailor a volume output limit 122 based upon particular presentation circumstances.

Some embodiments may be configured to notify the user that volume output of the controlled media presentation devices 128 is currently being limited. An exemplary embodiment generates a visual volume limiter notification 148 that is presented to the user, such as on the display 130 of the TV 128a. Any suitable text message and/or graphical icon may be used in a presented visual volume limiter notification 148. Alternatively, or additionally, embodiments may be configured to generate an audible volume limiter notification corresponding to a unique tone or sound. The audible volume limiter notification may be output from the controlled media presentation devices 128.

Based on the defined end time and/or the defined enforcement period specified in a volume output limit 122, enforcement of the volume output limit concludes at the defined end time and/or the defined duration. When the volume output limit enforcement concludes, volume control settings of the controlled media presentation devices 128 may be left at their current settings. Alternatively, the volume control settings of the controlled media presentation devices 128 may be changed back to the previous volume output setting in effect prior to the start of the enforcement period.

Figure 2:
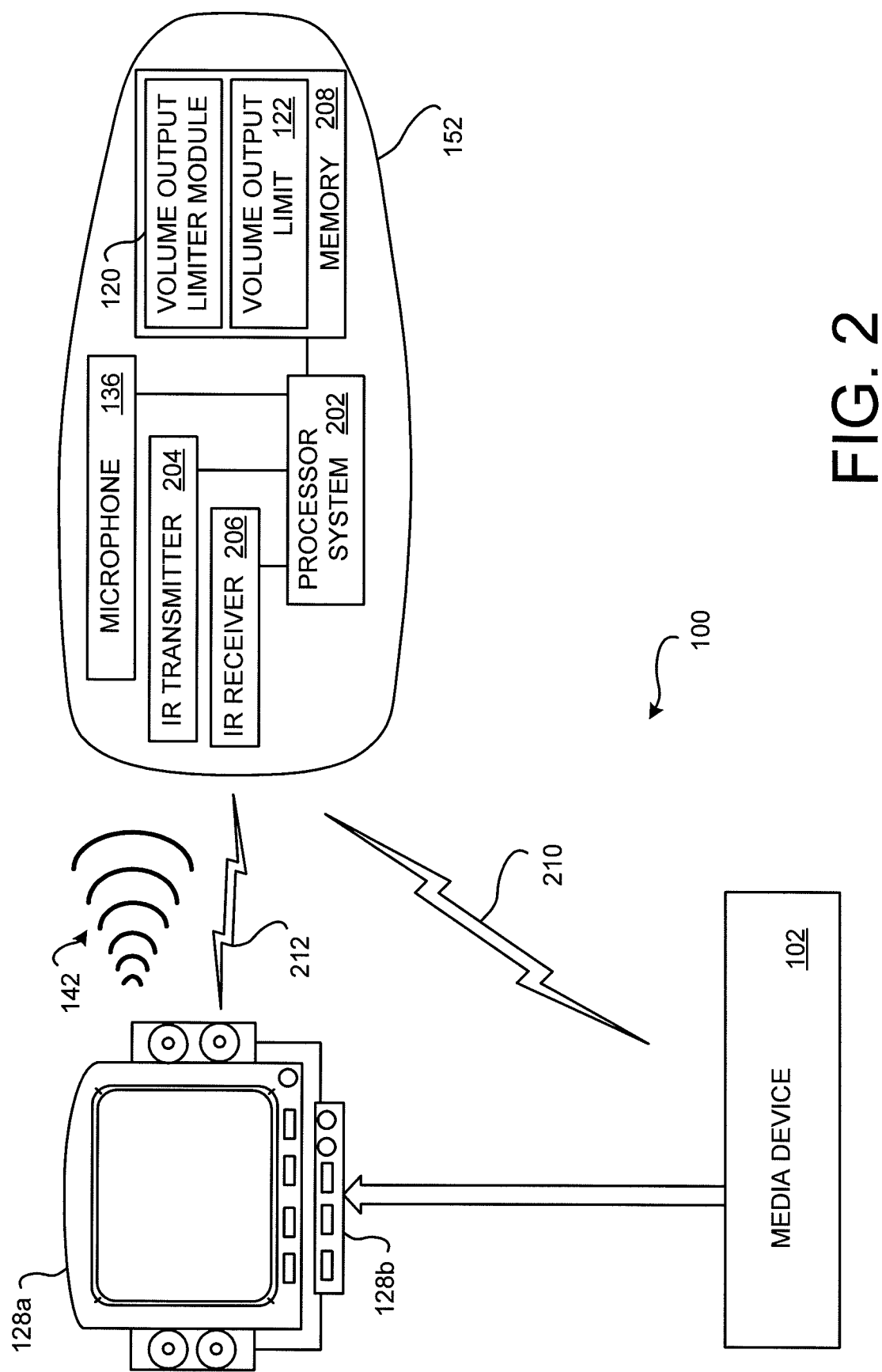
FIG. 2 is a block diagram of an embodiment of a scheduled volume limiter implemented in a remote control.

FIG. 2 is a block diagram of an embodiment of a scheduled volume limiter 100 implemented in an exemplary remote control 152. The remote control 152 comprises the microphone 136, a processor system 202, an infrared (IR) transmitter 204, an optional IR receiver 206, and a memory 208. In some embodiments, the volume output limiter module 120 resides in the memory 208 of the remote control 152. Additionally, or alternatively, one or more volume output limits 122 may be stored in the memory 208.

The microphone 136 residing in the remote control 152 detects sounds 142 corresponding to the volume output of the controlled media presentation devices 128. In an exemplary embodiment, the processor 202 processes information corresponding to the detected sound 142, and generates an IR signal 210 that is communicated to the media device 102 for enforcement of the current volume output limit 122.

In an alternative embodiment, the processor system 202 may execute the volume output limiter module 120 to compare the detected sound 142 to the maximum volume limit. The maximum volume limit may reside on the local volume output limit 122 stored in the memory 208 of the remote control 152. The processor 202 may then generate the volume output limit command, which corresponds to a volume change command or code that already is implemented in the remote control 152 for controlling audio levels. The generated volume output limit command can then be communicated to the media device 102 to enforce the current volume output limit 122.

Some embodiments of the remote control 152 may be configured to directly operate the controlled media presentation devices 128, thus optionally bypassing the media device 102. Such universal type remote controls 152 are configured to emulate the remote-control commands generated by a variety of remote controls each associated with a particular different media presentation device 128. Volume control codes are readily available within the remote control 152 for adjusting volume output of the various controlled media presentation devices 128. For example, when operating in a first mode, the remote control 152 may be configured to generate and communicate a volume output limit command that directly controls the TV 128a. When operating in a second mode, the remote control 152 may be reconfigured to generate and communicate a volume output limit command that directly controls the audio device 128b.

In alternative embodiments, the maximum volume limit may be retrieved from the local volume output limit 122 stored in the media device 102 and communicated back to the optional IR receiver 206. The remote control 152 may then generate and transmit a suitable volume output limit command 212 to change the volume control setting of the controlled media presentation devices 128 in accordance with the volume output limit 122. Alternatively, a volume output limit command may be generated by the media device 102 and then communicated to the remote control 152.

In other embodiments, the remote control 152 communicates using RF signals or another suitable wireless medium. Accordingly, the transmitter and the optional receiver may be suitable RF or other wireless media devices. Further, since a universal type remote control 152 is configured to control a variety of different media presentation devices 128, the transmitter and the optional receiver may be suitable RF or other wireless media devices may be included along with the IR transmitter 204 and the optional IR receiver 206.

Figure 3:
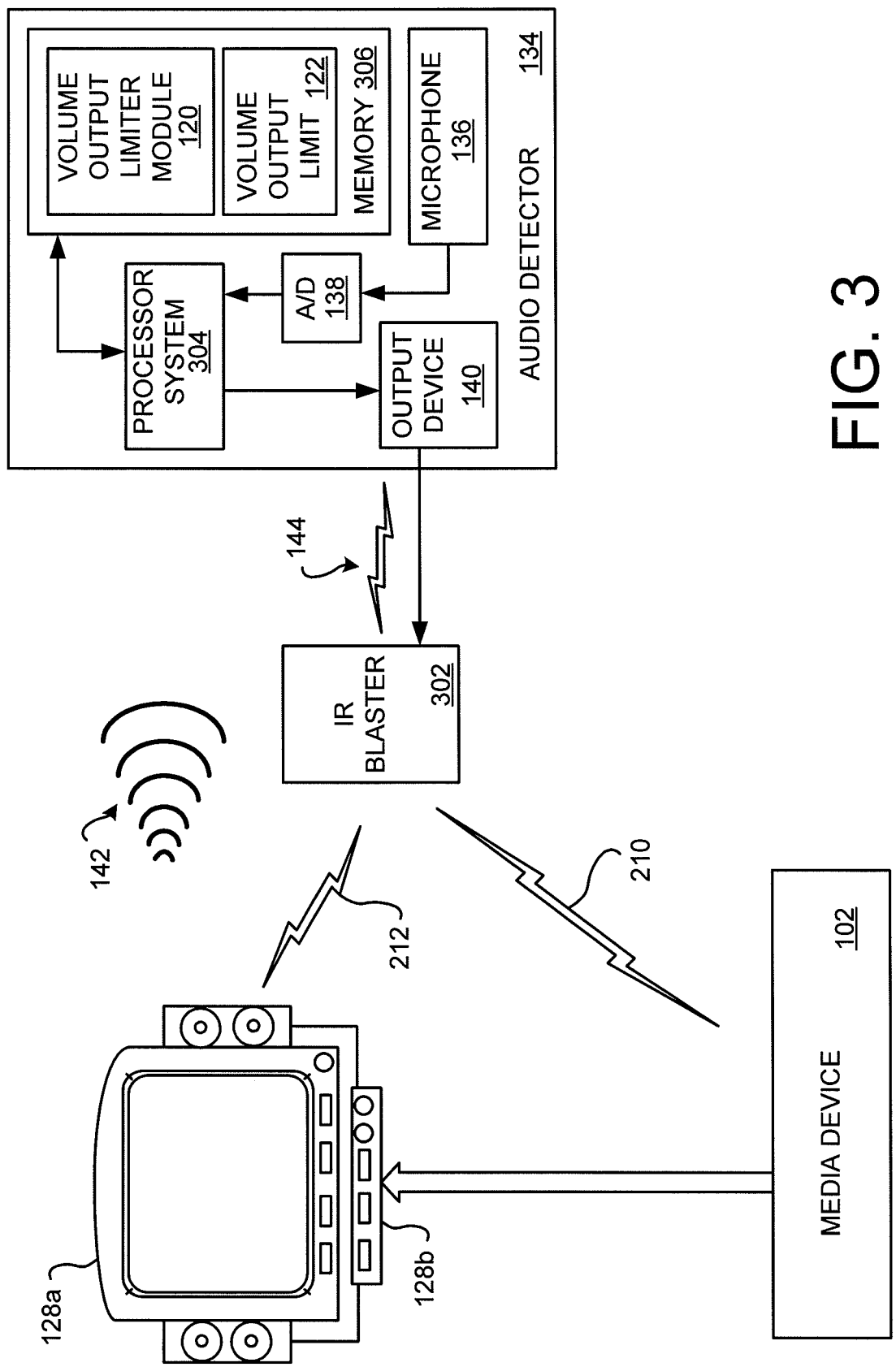
FIG. 3 is a block diagram of an embodiment of a scheduled volume limiter operating cooperatively with an infrared blaster.

FIG. 3 is a block diagram of an embodiment of a scheduled volume limiter 100 operating cooperatively with an infrared (IR) blaster 302. The IR blaster 302 is a communication device that is configured to emulate the remote-control commands generated by a variety of remote controls each associated with a particular different media presentation device 128. For example, when operating in a first mode, the IR blaster 302 may directly control the TV 128a. When operating in a second mode, the IR blaster 302 may directly control the audio device 128b. Accordingly, volume control codes are readily available within the IR blaster 302 for adjusting volume output of the various controlled media presentation devices 128.

In an exemplary embodiment, the audio detector 134 further comprises a processor system 304 and a memory 306. The volume output limiter module 120 resides in the memory 306 of the remote control 152. Additionally, or alternatively, one or more volume output limits 122 may be stored in the memory 306. The audio detector 134 generates the volume output limit command based upon the detected sound 142. The volume output limit command is communicated to the IR blaster 302 as the audio information 144. The IR blaster 302 generates and communicates suitable volume output control signals to the controlled media presentation devices 128.

It should be emphasized that the above-described embodiments of the scheduled volume limiter 100 are merely possible examples of implementations of the invention. Many variations and modifications may be made to the above-described embodiments. For example, but not limited to, the audio detector 134 may be implemented as a component of the media device 102. All such modifications and variations are intended to be included herein within the scope of this disclosure and protected by the following claims.

The invention claimed is:

1. A media device configured to limit volume output from a media presentation device, comprising;
an interface configured to receive a user specification that defines an enforcement period;
an audio detector interface configured to receive audio information communicated by an audio detector; and
a processor system communicatively coupled to the audio detector interface and the interface, wherein the processor system is configured to:
determine a start time of the enforcement period, wherein the start time of the enforcement period corresponds to a start time of a user selected program;
determine a volume level of a detected sound based on the audio information received from the audio detector, wherein the detected sound corresponds to the user selected program being presented by the media presentation device;
compare the volume level of the detected sound with a predefined maximum volume limit in response to a real time reaching the start time of the enforcement period; and
generate a volume output limit command in response to the detected sound exceeding the predefined maximum volume limit during the enforcement period.

2. The media device of claim 1, further comprising:
a memory configured to store the predefined maximum volume limit and the user specification.

3. The media device of claim 2, wherein the processor system is further configured to:
retrieve a duration of the enforcement period that has been previously stored in the memory of the media presentation device;
determine an end time of the enforcement period, wherein the end time of the enforcement period is determined based on the start time of the enforcement period and the duration of the enforcement period; and
compare current time with the determined end time; and
reduce an output volume of the media presentation device in accordance with the volume output limit command until the current time reaches the end time of the enforcement period.

4. The media device of claim 2, wherein the processor system is further configured to:
retrieve an end time of the enforcement period defined in the user specification that has been previously stored in the memory of the media presentation device; and
compare current time with the retrieved end time; and
reduce an output volume of the media presentation device in accordance with the volume output limit command until the current time reaches the end time of the enforcement period.

5. The media device of claim 1, wherein the user specification comprises:
first information that defines the start time of the enforcement period;
second information that defines at least one of a duration of the enforcement period and an end time of the enforcement period; and
third information that defines the predefined maximum volume limit associated with the enforcement period.

6. The media device of claim 1, wherein the audio detector is implemented in a remote control using a microphone.

7. The media device of claim 1, wherein the volume output limit command is configured to limit an output volume of the media presentation device that is presenting the detected sound to the predefined maximum volume limit associated with the enforcement period.

8. The media device of claim 1, wherein the processor system is further configured to generate an electronic program guide that is presented on a display.

9. The media device of claim 1, wherein the audio detector interface is configured to receive the audio information via an infrared signal or a radio frequency signal.

10. The media device of claim 1, wherein the volume output limit command is configured to modify an output volume of the media presentation device by clipping only a portion of the volume output whose level exceeds a threshold volume.

11. A method to limit volume output from a media presentation device, comprising;
receiving a user specification that defines an enforcement period;
receiving audio information from an audio detector;
determining, with a processor, a start time of the enforcement period, wherein the start time of the enforcement period corresponds to a start time of a user selected program;
determining, with the processor, a volume level of a detected sound based on the audio information received from the audio detector, wherein the detected sound corresponds to the user selected program being presented by the media presentation device;
comparing, with the processor, the volume level of the detected sound with a predefined maximum volume limit in response to a real time reaching the start time of the enforcement period; and
generating, with the processor, a volume output limit command in response to the detected sound exceeding the predefined maximum volume limit during the enforcement period.

12. The method of claim 11, further comprising storing the predefined maximum volume limit and the user specification in a memory device.

13. The method of claim 12, further comprising retrieving a duration of the enforcement period that has been previously stored in the memory device;
- determining an end time of the enforcement period, wherein the end time of the enforcement period is determined based on the start time of the enforcement period and the duration of the enforcement period; and
- comparing current time with the determined end time; and
- reducing an output volume of the media presentation device in accordance with the volume output limit command until the current time reaches the end time of the enforcement period.

14. The method of claim 12, further comprising
- retrieving an end time of the enforcement period defined in the user specification that has been previously stored in the memory device; and
- comparing current time with the retrieved end time and
- reducing an output volume of the media presentation device in accordance with the volume output limit command until the current time reaches the end time of the enforcement period.

15. The method of claim 11, wherein the user specification comprise
- first information that defines the start time of the enforcement period;
- second information that defines at least one of a duration of the enforcement period and an end time of the enforcement period; and
- third information that defines the predefined maximum volume limit associated with the enforcement period.

16. The method of claim 11, wherein the audio detector is implemented in a remote control using a microphone.

17. The method of claim 11, wherein the volume output limit command is configured to limit an output volume of the media presentation device that is presenting the detected sound to the predefined maximum volume limit associated with the enforcement period.

18. The method of claim 11, further comprising generating an electronic program guide that is presented on a display.

19. The method of claim 11, wherein receiving the audio information from the audio detector comprises receiving an infrared signal or a radio frequency signal that carries the audio information.

20. The method of claim 11, wherein the volume output limit command is configured to modify the volume output of the media presentation device by clipping only a portion of the volume output whose level exceeds a threshold volume.

* * * * *